United States Patent [19]

Nakagawa et al.

[11] Patent Number: 4,745,478
[45] Date of Patent: May 17, 1988

[54] RF SWITCH

[75] Inventors: Katsuya Nakagawa, Kusatsu; Yoshiaki Nakanishi, Kyoto, both of Japan

[73] Assignee: Nintendo Co., Ltd., Kyoto, Japan

[21] Appl. No.: 761,744

[22] Filed: Aug. 1, 1985

[51] Int. Cl.[4] .......................................... H04N 5/268
[52] U.S. Cl. ................................................. 356/181
[58] Field of Search .................. 358/83, 86, 181, 187, 358/188, 186, 189; 455/217, 300, 301, 317; 333/103; 455/78, 83

[56] References Cited

U.S. PATENT DOCUMENTS

| 3,889,050 | 6/1975 | Thompson | 358/86 |
| 4,276,562 | 6/1981 | Stewart et al. | 358/181 |
| 4,312,016 | 1/1982 | Glaab et al. | 358/188 |
| 4,349,750 | 9/1982 | Geurts | 358/181 |
| 4,361,854 | 11/1982 | Wolfe | 358/188 |
| 4,424,591 | 1/1984 | Boardman | 333/103 |
| 4,535,360 | 8/1985 | Briley et al. | 358/86 |
| 4,542,300 | 9/1985 | Nagatomi | 333/103 |

FOREIGN PATENT DOCUMENTS

| 1199807 | 9/1965 | Fed. Rep. of Germany | 358/181 |
| 0109078 | 8/1980 | Japan | 358/181 |
| 0028775 | 2/1984 | Japan | 358/181 |

Primary Examiner—Tommy P. Chin
Attorney, Agent, or Firm—Larry A. Jackson

[57] ABSTRACT

An RF switch comprises a housing in which a board is contained. To the board, two input ends connected respectively to an F-connector and an RCA plug and one output end connected to an antenna terminal of a TV receiver by an F-plug are connected. On the board, high-pass filters connected in a cascade fashion are formed, of which input is connected to one input end connected to the F-connector. The filter in each stage is earthed at the output side thereof through corresponding switching transistors. When a power switch of a main unit of a picture processing apparatus is turned on, a superposed signal of a DC signal and an RF signal is given to the remaining input end from the main unit through the RCA plug and a coaxial cable. In the RF switch, the DC signal is taken out from the superposed signal, thereby respective switching transistors are turned on. Accordingly, a TV signal from a TV antenna is flown into the earth, while the RF signal from the main unit it given to the output end through a diode biased in a forward direction by the DC signal. When the power switch of the main unit is in "off", the high-pass filters will not be inactivated and the TV signal from the TV antenna is thus given to the output end.

14 Claims, 2 Drawing Sheets

RF SWITCH

BACKGROUND OF THE INVENTION

1. Field of the Invention

The present invention relates to an RF switch. More specifically, the present invention relates to an RF switch for switching over an antenna input of a TV receiver when the TV receiver receiving a TV signal from an antenna is used as a monitor for a picture processing system, for example, such as a personal computer, a video game system or the like.

2. Description of the Prior Art

A video game system and a personal computer, for example, such as "ATARI 2600" (Trademark) and "COLECO VISION" (Trademark) which utilize a domestic TV receiver as a monitor are well known. In such video game and computer systems and the like, the TV signal input from a TV antenna or a VTR must be switched over to an RF signal (a TV signal) for the game or computer system. The switchover is necessary to avoid interference between the TV signals from the antenna and for the monitor as well as from spurious radiation of the monitor's RF signal.

Accordingly, in the past, one of the two TV signals has been selectively connected to the TV receiver, in general, by a mechanical switch, for example, a slide switch. Typically, the slide switch is connected to hang loosely in the vicinity of an antenna terminal of the TV receiver. When using, for example, the game system, the slide switch must be switched over by reaching, sometimes only by feel, around to the back side of the TV receiver to manually operate the switch. This operation is not only troublesome but also dangerous because of the high voltage equipment on the back side of the TV receiver.

SUMMARY OF THE INVENTION

A principal object of the present invention is, therefore, to provide an RF switch which is capable of switching over an antenna input automatically to a TV receiver from another video source, such as a picture processing system, when the TV receiver is used as a monitor.

Another object of the present invention is to provide an RF swtich that facilitates a change in circuit connections between RF circuit cables.

The present invention is, in brief, an RF switch comprising first and second inputs and an output. A first input end is connected for receiving a first TV signal. A filter means is connected between the first input end and the output. A second input end is adapted for receiving a second TV signal superposed on a DC control signal, to an output of the filter means, and circuit means are provided for inactivating said filter means in response to the DC control signal when applied to the second input end, and for transmitting said second TV signal to said output.

For example, when a power switch of a main unit of an apparatus providing a second TV signal is "off", the second TV signal is not present and hence is not applied to the RF switch. Accordingly, the filter means is not inactivated and in that state, the first TV signal, for example, from the TV antenna or a VTR is passed to an antenna terminal of the TV receiver through the output of the RF switch.

On the other hand, when the power switch of the main unit is turned on, the superposed second TV signal and the DC control signal are applied to the RF switch from the main unit. The circuit means for inactivating the filter means is actuated by the DC control signal, and thus the TV signal at the first input end is not transmitted to the output and the TV signal from the main unit (i.e., second TV signal) is applied to the output end by the transmitting circuit means and thence to the antenna terminal of the TV receiver. At this time, since the filter means has been inactivated, spurious radiation caused by the RF signal from the main unit of the picture processing apparatus is effectively prevented from leaking back to the first input end.

According to the present invention, since the source of TV signal can be automatically changed by simply turning on the power switch of the main unit of the apparatus supplying the second TV signal, such as a personal computer or video game apparatus, a manual switching operation is no longer required each time the apparatus is to be used.

In the preferred embodiment, the RF switch is formed on a board contained in a housing. The housing in turn is formed with two different, optional cable guide portions for guiding the connecting cable from the main unit the second TV signal apparatus in the most convenient direction. One of the cable guide portions routes the cable from the housing in a first direction and the other guide portion routes the cable in a second and different direction, so that the most suitable cable direction can be selected according to the arranged positions of the main unit supplying the second TV signal, the TV antenna and the TV receiver or monitor.

These objects and other objects, features, aspects and advantages of the present invention will become more apparent from the following detailed description of the embodiment when taken in connection with the accompanying drawings.

BRIEF DESCRIPTION OF THE DRAWINGS

FIG. 3 is a graph showing an attenuation versus frequency characteristic for explaining an aspect of the operation of the embodiment of FIG. 2.

FIG. 4 is a circuit diagram showing a modified portion of another embodiment.

FIG. 5 is a circuit diagram showing a modified portion of another embodiment of FIG. 2.

FIG. 6(A) is an illustrated plan view of the structure of the RF switch embodiment of FIG. 1; FIG. 6(B) is a left side view; FIG. 6(C) is a right side view; and FIG. 6(D) is a front view.

FIG. 7 is an exploded perspective view showing the housing of FIGS. 6(A), (B), (C) and (D).

DESCRIPTION OF THE PREFERRED EMBODIMENT

Figure 1:
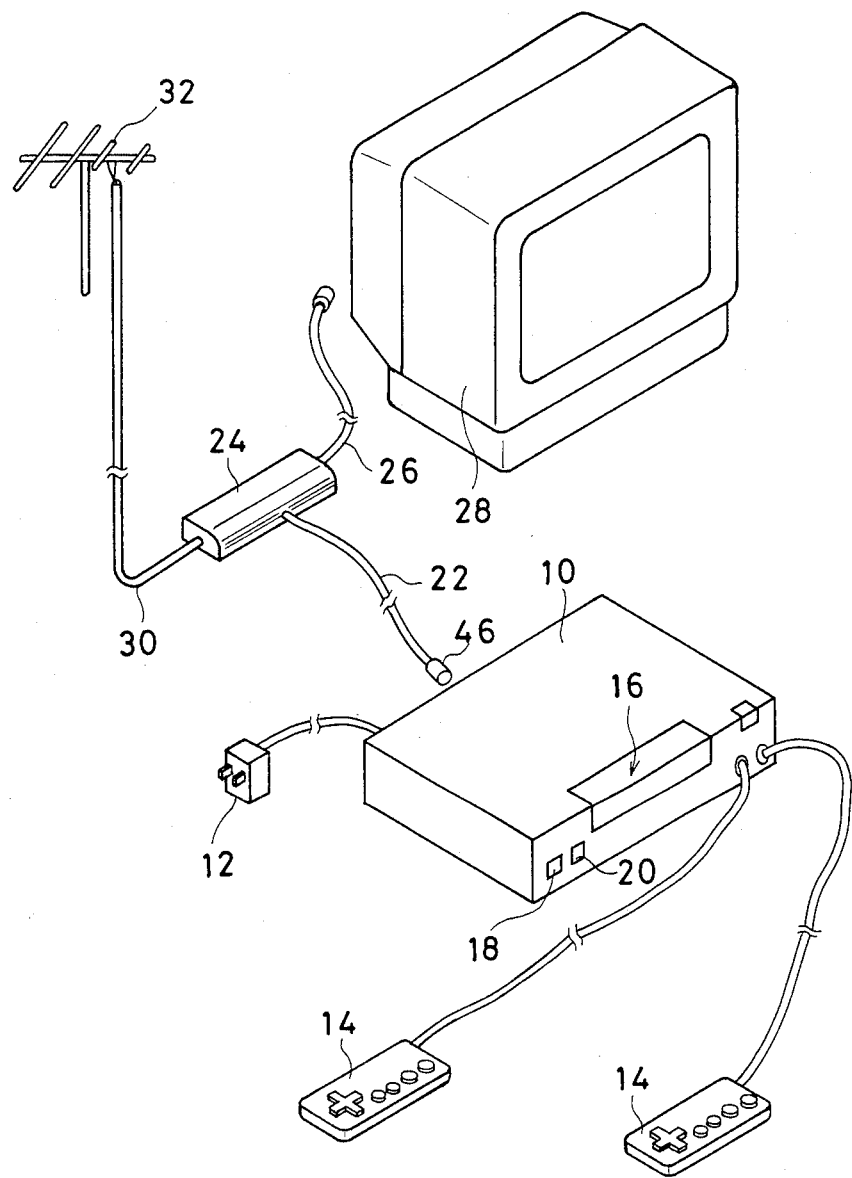
FIG. 1 is a schematic perspective view showing a video game system incorporating the RF switch of the present invention.

FIG. 1 is a schematic perspective view showing a video game system in which the RF switch 24 of the present invention is incorporated. The present invention will be described in this video game system environment. However, it is noted that the present invention may in general be utilized in systems using a domestic TV receiver as a monitor for an information processing system or a picture processing system such as a personal computer.

To a main unit 10 of such a game apparatus, a commercial power source is supplied through an AC adapter 12. To the main unit 10, two controllers 14 are connected by suitable connecting cables. Also, on the main unit 10, a cartridge receiving port 16 for a program ROM cartridge (see FIG. 2) for the game is provided. Accordingly, in the main unit 10, the TV signal for the game is generated according to the content of the inserted ROM cartridge. On the main unit 10, a power switch 18 and a reset switch 20 are further provided. The power switch 18 is for turning on the power source of the main unit 10 and the reset switch 20 is for resetting the content of the game.

As an example of such a video game system, reference is made to products available under the names "Family-Computer" (trademark) or "Nintendo Entertainment System" (trademark) manufactured by the assignee of the present invention.

The main unit 10 is connected to RF switch 24 through a coaxial cable 22. The RF switch is connected to an antenna terminal of a conventional TV receiver 28 through a coaxial cable 26. The RF switch 24 is further connected to a TV antenna 32 by a feeder cable 30. The RF switch 24 operates to switch over the TV signal applied to receiver 28 from the TV antenna 32 and to the TV signal from the game system main unit 10 so as to select either of them for connection to the TV receiver 28.

Figure 2:
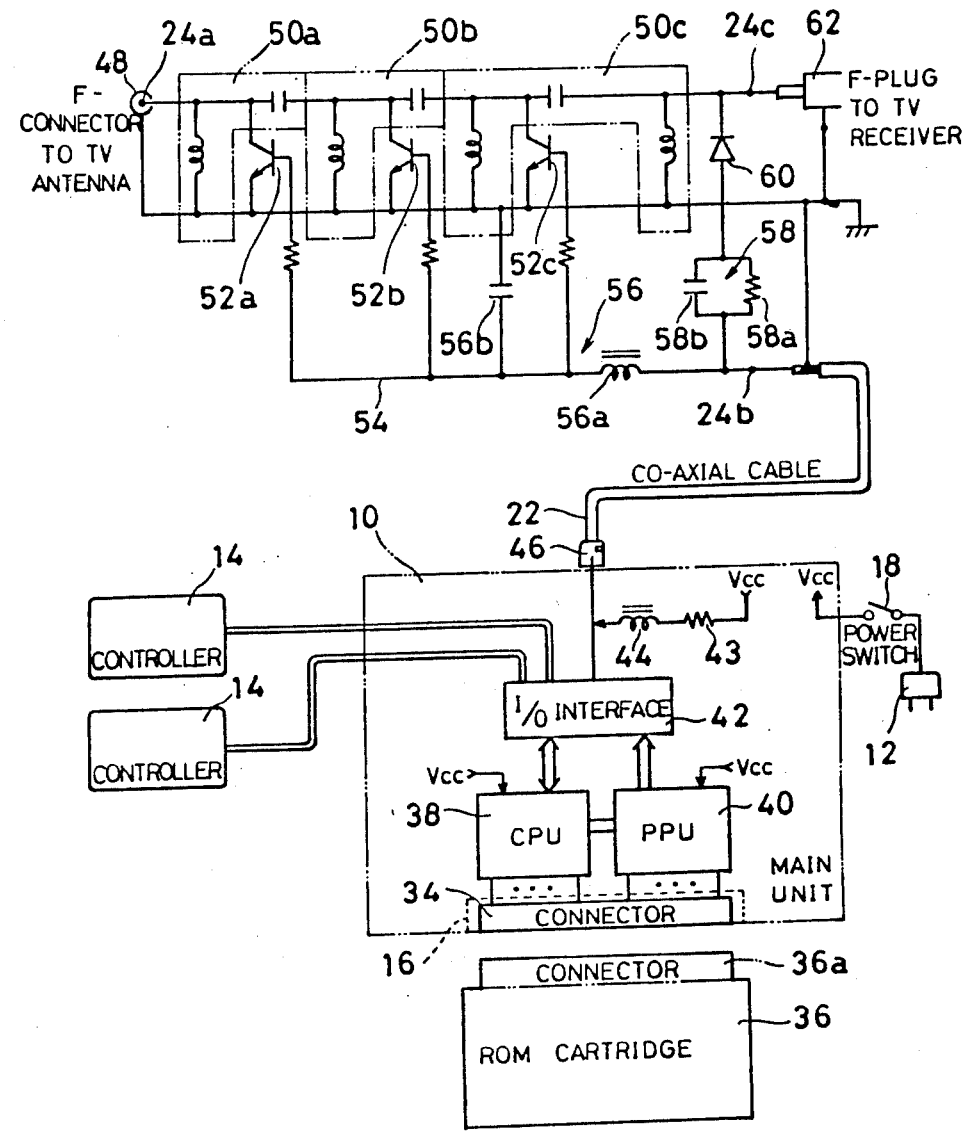
FIG. 2 is a circuit diagram showing the embodiment of FIG. 1.

Referring to FIG. 2, the cartridge port 16 of the main unit 10 is provided with a connector 34. Plugged into the connector 34 is a connector 36a of the ROM cartridge 36. In the embodiment, the connector 36a is formed as a male part arranged with a plurality of pins and the connector 34 is formed as a female part to receive these pins. The connector 34 is connected to a CPU 38 and a PPU 40, for example, by flat cables or other wiring. The CPU 38 and the PPU 40 are connected mutually as well as to an I/O interface 42, to which two controllers 14 are connected.

The CPU 38 provides video picture data necessary to play the game to the PPU 40 based upon game program data from a ROM (not shown) included in the ROM cartridge 36 and control signals from the controllers 14. As the CPU 38, a microprocessor, for example, such as an integrated circuit "Z80A" made by Zilog Inc. may be used. The PPU 40 is for generating the TV signal of NTSC standard, for example, based upon the picture data from the CPU 38. As the PPU 40, for example, an integrated circuit "2C03" made by Nintendo Co., Ltd. may be used.

The picture signal from the PPU 40, that is, the TV signal is applied to the coaxial cable 22 through the I/O interface 42. To the coaxial cable 22, a DC control voltage, for example, of about 3 volts from the AC adapter 12 (FIG. 1) is also applied through the power switch 18, a protective resistor 43 and a choke coil 44. The protective resistor 43 is for protecting the power source (Vcc) of the main unit 10 even if the main unit 10 at RCA plug 46 is erroneously short-circuited by an operator. A resistance value of the protective resistor 43 is selected relatively high such that it allows current sufficient to turn on switching transistors 52a–52c to be supplied to the RF swtich 24. The choke coil 44 prevents the TV signal from the PPU 40 from flowing into the power line through the AC adaptor. Thus, the superposed TV signal from the PPU 40 and the DC control voltage are outputted to the coaxial cable 22, which is connected to the RF switch 24.

In the RF switch 24, a first input end 24a is connected to an F-connector 48 which in turn is connected to the TV antenna 32 through the feeder cable 30 (FIG. 1). A second input end 24b receives the above-mentioned coaxial cable 22 and an output end 24c is connected to an F-plug 62 by a coaxial cable.

Between input end 24a and the output end 24c, three-stage high-pass filters 50a, 50b and 50c are connected in cascade. In this embodiment, the high-pass filters 50a–50c are constructed as a π-type filter. The output sides of respective filters 50a, 50b and 50c are selectively grounded through switching transistors 52a, 52b and 52c to disable, i.e., inactivate, the filters. These switching transistors 52a–52c are connected to a DC voltage line 54 via suitable current-limit resistors. The DC voltage line 54 is connected to the above mentioned second input end 24b via a choke circuit 56 including a choke coil 56a and a by-pass capacitor 56b. The choke circuit 56 serves as a highfrequency blocking circuit for blocking the TV signal present at the second input end 24b from flowing back to the first input end 24a and causing RF interference to be radiated therefrom.

Between the output end 24c and the second input end 24b, a series connection of a bias circuit 58 and a switching diode 60 are connected. The bias circuit 58 includes a parallel circuit of a resistor 58a and a capacitor 58b, and develops a DC voltage to bias the diode 60 as well as prevent a direct short-circuit between the input end 24b and the output end 24c. The capacitor 58b is for passing the TV signal from the game main unit 10 at the input end 24b to the output end 24c through the diode 60.

The output end 24c of RF switch 24 is connected to the F-plug 62 through a coaxial cable. The F-plug 62 is connected to an F-connector (not shown) of the antenna terminal of the TV receiver 28.

For the purpose of shielding respective inner conductors, outer conductors of the coaxial cable 22, the F-connector 48 and the F-plug 62 are all grounded.

In operation, when the RCA plug 46 is not connected to the main unit 10, or when it is connected but the power switch 18 of the main unit 10 is off, that is, when the TV receiver 28 (FIG. 1) is not used as the monitor for the game system, the input end 24b has no applied signal whatever. Accordingly, the switching transistors 52a–52b remain off and the diode 60 is also off. Therefore, the respective filters 50a–50c are not disabled. In this state, the TV signal from the TV antenna 32 (FIG. 1) or a VTR (not shown) applied at the F-connector 48 to the first input end 24a, is transmitted to the output end 24c through the active three-stage filters 50a–50c and thence to the TV receiver 28 (FIG. 1) therefrom through the F-plug 62. Thus, when the filters 50a–50c are not disabled, the TV signal from the first input end 24a is given to the TV receiver 28 almost without attenuation as shown by a plotted line X in FIG. 3.

When the RCA plug 46 is connected to the main unit 10 and the power switch 18 of the main unit 10 is turned on, the superposed RF signal for the game, generated by the content of the ROM cartridge 36 and PPU 40, and the DC control signal applied through the power switch 18, protective resistor 43 and choke coil 44 are outputted to the coaxial cable 22. The superposed RF and DC control signals are applied to the second input end 24b through the inner conductor of the coaxial cable 22. The DC control signal component is coupled to respective switching transistors 52a-52c through the choke coil 56a and the DC voltag eline 54. Thus, the switching transistor 52a-52c are turned on and the output sides of the corresponding filters 50a-50c are grounded. Therefore, the filters 50a-50c are disabled. Accordingly, even if the TV signal is present at the first input end 24a through the F-connector 48, the TV signal will be grounded through the inactivated filters 50a-50c, namely, through the switching transistors 52a-52c and substantially attenuated as shown by a plotted line Y in FIG. 3. The TV signal at input end 24a thus does not appear at the output end 24c.

At this same time, the TV signal present at the second input end 24b is blocked by the choke circuit 56 so it does not leak back to the first input end 24a through the filters 50a-50c.

The DC control signal (DC voltage) present at the second input end 24b is applied to the diode 60 through the resistor 58a of the bias circuit 58, generating a forward voltage across the diode 60 of approximately 0.7 volts. Therefore, the diode 60 is turned on. The TV signal at the second input end 24b is passed through the diode 60 via the capacitor 58b of the bias circuit 58 to the output end 24c, since the diode 60 is in a low impendance "on" state. The TV signal (RF signal) from the main unit 10 thereby appears at the output end 24c and is applied to the antenna terminal (not shown) of the TV receiver 28 through the F-plug 62 as in the previous case.

Thus, by turning on or off the power switch 18 of the main unit 10, the RF switch changes the TV signal available at the output end 24c. Accordingly, when the TV game apparatus is not being used, a TV broadcast may be received by the TV receiver 28. To play the TV game, the power switch 18 of the main unit 10 is turned on to automatically disable the TV broadcast signal and to cause only the TV game signal from the main unit 10 to be applied to the TV receiver 28.

FIG. 4 is a circuit diagram showing a modified form of certain portions of the main unit 10 of the FIG. 2 embodiment. In the FIG. 4 embodiment, the I/O interface 42 includes an RF modulation circuit 42a to which an output of the power switch 18 is applied through a slide switch 19 and through a conductive printed circuit pattern 36a formed in U-shape letter at an edge of the plug-in board of the ROM cartridge 36. The slide switch 19 is for turning off the power source to the RF modulation circuit 42a while the power switch 18 remains in its ON state. The power switch 18 and the slide switch 19 are connected to each other through the conductive pattern 36b only when the connector 36a of the ROM cartridge 36 is plugged into the connector 34 of the main unit 10. The DC voltage Vcc thus cannot be applied to the RF modulation circuit 42a even if both the power switch 18 and the slide switch 19 are ON when ROM cartridge 36 is detached. An RF signal passing from the second input end 24b to an output end 24c is cut off automatically, and the TV signal from the first input end 24a is applied to the output end 24c.

FIG. 5 is a circuit diagram showing a modified example of the embodiment of FIG. 2 especially the RF switch. In the embodiment shown, filters 50a, 50b and 50c are constructed as a T-type filter. Other aspects are identical with FIG. 2 so the duplicate description will be omitted here.

The RF switch 24 described above may be incorporated into the main unit 10 or the TV receiver 28. However, it is preferably constructed separately from these units as shown in FIG. 1.

Now, referring to FIGS. 6 and 7, the structure of the RF switch 24 will be described in detail. The RF switch 24 comprises a housing 64 having alower shell 64a and an upper shell 64b mated therewith. The housing 64 is formed in a plan rectangle and provided therein with a board 66 having the filter circuit and associated components as shown in FIG. 2 or FIG. 4 mounted thereon. The coaxial cable 22, the F-connector 48 and the F-plug 62 (FIG. 2) are connected to the board 66. The F-connector 48, the coaxial cable 22 and the F-plug 62 are connected respectively to the first input end 24a, the second input end 24b and the output end 24c as previously described.

As clearly understood from FIG. 7, housing 64 is formed with holes 68 and 70 that accommodate the insertion of the F-connector 48 and the F-plug 62, and a hole 72 that serves to guide coaxial cable 22 to the outside of the housing 64. Along one of the longer sides of the housing shells 64a and 64b, channels 74a and 74b are formed. Then, in the channels 74a and 74b, a plurality of protrusions 76a, 76a—and 76b, 76b—are formed in a staggered fashion as shown in FIG. 6(D).

In the example shown in FIG. 6(A), the coaxial cable 22 is guided out of the housing in an orthogonal direction relative to the long side of the rectangular housing 64. But, depending upon the arrangement of the main unit 10 and the TV receiver 28, there may be a case in which this configuration of the coaxial cable 22 is impractical. Accordingly, in the embodiment, the coaxial cable 22 is adapted to be guided out of the housing 64 parallel to the long side thereof by utilizing the channels 74a and 74b as shown by the doube dotted line in FIG. 6(A). Coaxial cable 22 is held in the channel 74 by the protrusions 76a and 76b formed in the respective channels.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An RF switch adapted to selectively connect one of two video source signals to a television monitor, comprising:

a first input for receiving a first television signal;

a second input for receiving a second television signal from an auxiliary source in which the auxiliary source is adapted to produce a DC control signal superimposed on the second television signal;

an output adapted to be connected to said television monitor;

a plurality of inductive-capacitive filters connected in cascade between said first input and said output, each said inductive-capacitive filter having an associated transistor switch including a control input and connected to provide an impedance path switchable to a low impedance state so as to ground each said filter in response to a control voltage applied to said control input;

an RF choke connecting said control input of said associated transistor switch of each said inductive-capacitive filters to said second input for causing said associated transistor switch to switch to said low impedance state in response to said DC control signal superimposed on said second television signal so as to inactivate said inductive-capacitive filters and thereby isolate said first television signal from said output; and a voltage controlled signal transmitting circuit connected between said second input and said output, said transmitting circuit comprising a diode connected in series with a parallel resistive-capacitive network, said diode having a high impedance reverse bias state in the absence of said DC control signal at said second input so as to isolate said output from said second input, and said diode being responsive to a bias voltage developed across said resistive-capacitive network in response to said DC control signal to assume a low impedance forward biased condition that transmits the second television signal through said resistive-capacitive network and through said diode to said output for application to the television monitor.

2. A video game system comprising:

means for supplying a first TV signal;

a main unit for generating a second TV signal for displaying a video game, said main unit including means for generating a DC control signal that is superimposed on said second TV signal;

an RF switch having a first input end for receiving said first TV signal and a second input end for receiving said second TV signal and said superimposed DC signal, and an output end adapted to be connected to a television monitor;

a plurality of inductive-capacitive filters connected in cascade fashion to form a signal path between said first input end to said output end of said RF switch;

voltage controlled switching means for inactivating said filters having a first and at least a second voltage controlled semiconductor switching element for selectively inactivating said filters to block said first TV signal from said output end in response to said DC control signal superimposed on said second TV signal, said first semiconductor switching element being connected between one of said inductive-capacitive filters and ground, and said second semiconductor switching element being connected between another of said inductive-capacitive filters and ground, said first and second semiconductor switching elements being turned on and off in response to said DC control signal superimposed on said second TV signal such that when on said first and second semiconductor switching elements inactivate said inductive-capacitive filters by connecting said signal path to ground; and voltage controlled transmitting means for transmitting said second TV signal to said output end of said RF switch in response to said DC control signal superimposed on said second TV signal.

3. A video game system in accordance with claim 2, wherein said transmitting means includes a diode connected between said second input end and said output end.

4. A video game system in accordance with claim 3, wherein said transmitting means includes a capacitor connected between said second input end and said diode, and a resistor connected in parallel with said capacitor for preventing a direct short-circuit between said second input end and said output end and for providing a bias in a forward direction to said diode.

5. A video game system in accordance with claim 2, which further comprises means for blocking the transmission of said second TV signal for video game to said first input end from said second input end.

6. A video game system in accordance with claim 2, wherein said main unit includes a power switch and a superposing means for superposing said DC signal on said second TV signal for video game when said power switch is turned on.

7. A video game system in accordance with claimm 6, wherin said superposing means includes a high frequency blocking means for preventing said second TV signal for video game to flow into a commercial power source from said main unit through said power switch.

8. A video game system in accordance with claim 7, wherein said high frequency blocking means includes a choke coil.

9. An RF switch comprising:

a first input end for receiving a first TV signal;

an output end;

a plurality of inductive-capacitive filters connected in a cascade fashion to form a filtered signal path between said first input end and said output end;

voltage controlled switching means for controlling said filter means and including a first semiconductor switching element connected between one of said inductive-capacitive filters and ground and at least a second semiconductor switching element connected between another of said inductive-capacitive filters and ground;

a second input end for receiving a second TV signal and a DC control signal superimposed on said second TV signal;

said first and second semiconductor switching elements being turned on in response to said DC control signal to cause said filtered signal path of said inductive-capacitive filters to be connected to ground thereby inactivating said inductive-capacitive filters to block said first TV signal; and voltage controlled transmitting means for transmitting said second TV signal to said output end in response to said second TV signal and said DC control signal being applied to said second input end.

10. An RF switch in accordance with claim 9, wherein said transmitting means includes a diode connected between said second input end and said output end.

11. An RF switch in accordance with claim 10, wherein said transmitting means includes a capacitor connected between said second input end and said diode, and a resistor connected in parallel with said capacitor for preventing a direct short-circuit between said second input end and said output end and for providing a bias in a forward direction to said diode.

12. An RF switch in accordance with claim 9, which further comprises means for blocking the transmission of said second TV signal from said second input end to said first input end.

13. An RF switch in accordance with claim 12, wherein said blocking means includes a choke coil connected to said second input end at one end thereof and a by-pass capacitor connected between another end of said choke coil and a ground.

14. An RF switch in accordance with claim 9, which further comprises a housing, and a circuit board contained within said housing, first and second input ends and said output end being connected to said circuit board, a connecting cable joined to said second input end, and said housing comprising first and second cable guide portions for selectively guiding said connecting cable from said second input end in either of two different optional directions relative to said housing.

* * * * *